United States Patent
Zhang

(10) Patent No.: US 10,204,972 B2
(45) Date of Patent: Feb. 12, 2019

(54) OLED DISPLAY DEVICE AND METHOD FOR PRODUCING ORGANIC TRANSISTOR

(71) Applicants: BOE Technology Group Co., Ltd., Beijing (CN); Ordos Yuansheng Optoelectronics Co., Ltd., Inner Mongolia (CN)

(72) Inventor: Hao Zhang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/531,037

(22) PCT Filed: Jun. 20, 2016

(86) PCT No.: PCT/CN2016/086388
§ 371 (c)(1),
(2) Date: May 26, 2017

(87) PCT Pub. No.: WO2017/161708
PCT Pub. Date: Sep. 28, 2017

(65) Prior Publication Data
US 2018/0047795 A1    Feb. 15, 2018

(30) Foreign Application Priority Data
Mar. 22, 2016 (CN) .......................... 2016 1 0166468

(51) Int. Cl.
*H01L 29/417* (2006.01)
*H01L 27/32* (2006.01)
(Continued)

(52) U.S. Cl.
CPC ............ *H01L 27/326* (2013.01); *H01L 27/32* (2013.01); *H01L 27/3274* (2013.01);
(Continued)

(58) Field of Classification Search
CPC ........... H01L 51/5296; H01L 29/41708; H01L 29/66287; H01L 29/7322; H01L 29/7395
See application file for complete search history.

(56) References Cited

U.S. PATENT DOCUMENTS

| 8,927,972 B2 | 1/2015 | Nakayama et al. |
| 2012/0146011 A1* | 6/2012 | Nakayama ............. B82Y 10/00 257/40 |
| 2017/0186973 A1* | 6/2017 | Ren ..................... H01L 51/0072 |

FOREIGN PATENT DOCUMENTS

| CN | 1897323 A | 1/2007 |
| CN | 101196489 A | 6/2008 |

(Continued)

OTHER PUBLICATIONS

First Office Action from Chinese Patent Application No. 201610166468.7, dated Oct. 20, 2017, 10 pages.
(Continued)

*Primary Examiner* — Hoai V Pham
(74) *Attorney, Agent, or Firm* — Westman, Champlin & Koehler, P.A.

(57) ABSTRACT

Embodiments of the present disclosure provide an organic transistor, a method for producing the same and an OLED display device. The organic transistor includes: a collector and an emitter stacked above a substrate; a first organic semiconductor layer, a second organic semiconductor layer and a base between the first and second organic semiconductor layers, stacked and provided between the collector and the emitter; wherein the base forms a Schottky contact with the first organic semiconductor layer and forms a
(Continued)

Schottky contact with the second organic semiconductor layer.

12 Claims, 4 Drawing Sheets

(51) Int. Cl.
  *H01L 51/05* (2006.01)
  *H01L 51/50* (2006.01)
  *H01L 51/52* (2006.01)
  *H01L 51/56* (2006.01)
(52) U.S. Cl.
  CPC ............ *H01L 51/05* (2013.01); *H01L 51/508* (2013.01); *H01L 51/5064* (2013.01); *H01L 51/5253* (2013.01); *H01L 51/56* (2013.01); *H01L 2227/323* (2013.01)

(56) References Cited

FOREIGN PATENT DOCUMENTS

| CN | 102484072 A | 5/2012 |
| JP | 2009081237 A | 4/2009 |
| JP | 2010-135809 A | 6/2010 |

OTHER PUBLICATIONS

International Search Report and Written Opinion for International Application No. PCT/CN2016/086388, dated Dec. 19, 2016, 9 pages.
English translation of International Search Report and Written Opinion for International Application No. PCT/CN2016/086388, 9 pages.

* cited by examiner

US 10,204,972 B2

OLED DISPLAY DEVICE AND METHOD FOR PRODUCING ORGANIC TRANSISTOR

CROSS-REFERENCE TO RELATED APPLICATION

This application is a Section 371 National Stage of International Application No. PCT/CN2016/086388, filed on 20 Jun. 2016, which has not yet published, and claims priority to Chinese Patent Application No. 201610166468.7, entitled with "an Organic Transistor, Method for Producing the Same and OLED Display Device" and filed with SIPO on Mar. 22, 2016, which is incorporated herein by reference in their entirety.

BACKGROUND OF THE DISCLOSURE

Field of the Disclosure

The present disclosure relates to technical field of display, and in particular, to an organic transistor, a method for producing the same and an OLED display device.

Description of the Related Art

Because Organic Light Emitting Diodes (abbreviated as OLEDs) display devices have advantages such as vivid color, ultra-thin thickness, energy conservation, a wide visual angle or the like, they are deemed to be a new generation display technique.

For Active-Matrix Organic Light Emitting Diodes (abbreviated as AMOLEDs) display devices, they need driver transistors to drive the OLEDs to actively emit light.

Currently, there are various kinds of transistors, which are classified mainly depending on different materials of active layers therein. For example, the material for the active layer can be amorphous silicon, metallic oxides, or organic materials, etc. Since carriers of the organic materials have low mobility, they are subject to more restrictions in applications of the prior art.

SUMMARY

One of objectives of the present application is to provide an organic transistor, a method for producing the same and an OLED display device, which can at least partially relieve the problem that the mobility is low for the organic semiconductor materials.

In a first aspect of the present application, it provides an organic transistor including:

a collector and an emitter stacked above a substrate;

a first organic semiconductor layer, a second organic semiconductor layer and a base between the first and second organic semiconductor layers, stacked and provided between the collector and the emitter;

wherein the base forms a Schottky contact with the first organic semiconductor layer and forms a Schottky contact with the second organic semiconductor layer.

In one example, both the first organic semiconductor layer and the second organic semiconductor layer include P-type semiconductor or N-type semiconductor.

In one example, both the first organic semiconductor layer and the second organic semiconductor layer are made of P-type semiconductor, and the base is made of a material having a low work function; or both the first organic semiconductor layer and the second organic semiconductor layer are made of N-type semiconductor, and the base is made of a material having a high work function.

In one example, the P-type semiconductor is PbPc or CuPc.

In one example, materials of the collector, the emitter and the base are selected from any of Au, Al, Cu, Ag, ITO, IZO, conductive polymer materials and conductive nano-meter structures or any combination thereof.

In one example, a thickness of the base is in a range of 20-30 nm.

In one example, a sum of thicknesses of the first organic semiconductor layer and the second organic semiconductor layer is in a range of 170-230 nm.

In one example, one of the collector and the emitter is located close to the substrate, while the other one of them is located distant from the substrate.

In a second aspect of the present application, it also provides an OLED display device including:

a driver transistor and a light emitting layer, wherein the driver transistor is the organic transistor as described above.

In one example, the OLED display device further includes a hole injection layer and a hole transmission layer;

the collector in the organic transistor is located close to the substrate, the first organic semiconductor layer, the base and the second organic semiconductor layer are provided above the collector in sequence, and the hole injection layer, the hole transmission layer and the light emitting layer are provided between the second organic semiconductor layer and the emitter in sequence;

wherein both the first organic semiconductor layer and the second organic semiconductor layer include P-type semiconductor.

In one example, the OLED display device further includes an electron transmission layer provided between the emitter and the light emitting layer.

In one example, the OLED display device further includes an electron injection layer provided between the emitter and the electron transmission layer.

In one example, the OLED display device further includes a hole barrier layer provided between the electron transmission layer and the light emitting layer.

In a third aspect of the present application, it yet provides a method for producing an organic transistor including:

forming by an evaporation process a collector and an emitter stacked each other above a substrate, and a first organic semiconductor layer, a second organic semiconductor layer and a base stacked and provided between the collector and the emitter, wherein the base is located between the first organic semiconductor layer and the second organic semiconductor layer;

wherein the base forms a Schottky contact with the first organic semiconductor layer and forms a Schottky contact with the second organic semiconductor layer.

In one example, both the first organic semiconductor layer and the second organic semiconductor layer include P-type semiconductor or N-type semiconductor.

In one example, the P-type semiconductor is PbPc or CuPc.

In one example, materials of the collector, the emitter and the base are selected from any of Au, Al, Cu, Ag, ITO, IZO, conductive polymer materials and conductive nano-meter structures or any combination thereof.

In one example, a thickness of the base is in a range of 20-30 nm.

In one example, a sum of thicknesses of the first organic semiconductor layer and the second organic semiconductor layer is in a range of 170-230 nm.

In one example, one of the collector and the emitter is located close to the substrate, while the other one of them is located distant from the substrate.

BRIEF DESCRIPTION OF THE DRAWINGS

In order to explain technical solutions of embodiments in the present application or in the prior art more clearly, the drawings for the embodiments or the prior art will be described briefly below. Apparently, the following drawings show only some of embodiments in the present application. From these drawings, the skilled person in the art may also obtain other drawings without any creative efforts.

DETAILED DESCRIPTION OF PREFERRED EMBODIMENTS OF THE DISCLOSURE

Below, technical solutions of embodiments of the present application will be described clearly and completely in conjunction with drawings for the embodiments. Apparently, the described embodiments are only a part of all embodiments of the present application, rather than all of the embodiments. From the embodiments of the present application, all other embodiments which can be obtained by the person skilled in the art without any inventive efforts belong to the scope of the present application.

Figure 1:
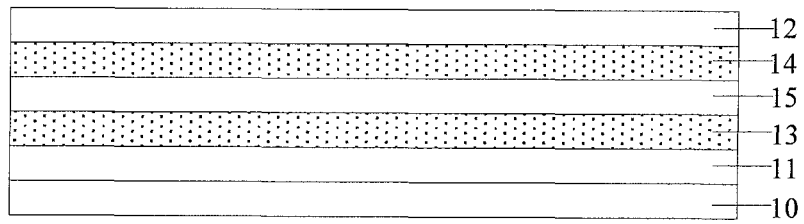
FIG. 1 is a schematic view showing a structure of an organic transistor according to an embodiment of the present application.
Figure 2:
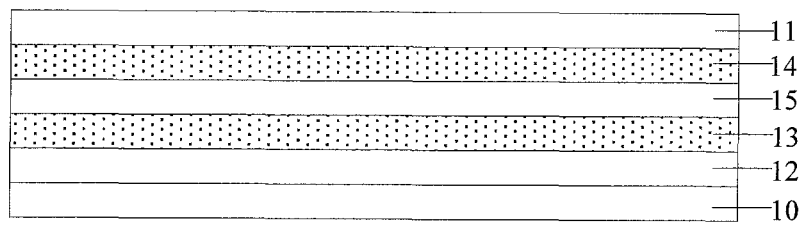
FIG. 2 is a schematic view showing a structure of another alternative organic transistor according to an embodiment of the present application.

An embodiment of the present application provides an organic transistor, as shown in FIGS. 1 and 2. It includes a collector 11 and an emitter 12 stacked above a substrate 10; and a first organic semiconductor layer 13, a second organic semiconductor layer 14 and a base 15 between the first and second organic semiconductor layers 13 and 14. The first organic semiconductor layer 13, the second organic semiconductor layer 14 and the base 15 are stacked between the collector 11 and the emitter 12.

Specifically, Schottky Contacts are respectively formed between the base 15 and the first organic semiconductor layer 13, and between the base 15 and the second organic semiconductor layer 14.

It should be noted that firstly, the collector 11 and the emitter 12 can be disposed as shown in FIG. 1, i.e., the collector 11 is located close to the substrate 10, and the emitter 12 is located distant from the substrate 10; or they can be disposed as shown in FIG. 2, the collector 11 is located distant from the substrate 10 and the emitter 12 is located close to the substrate 10.

Secondly, both the first organic semiconductor layer 13 and the second organic semiconductor layer 14 can be a P-type semiconductor layer or a N-type semiconductor layer.

The first organic semiconductor layer 13 and the second organic semiconductor layer 14 together constitute an active layer of the organic transistor.

Thirdly, materials for the collector 11, the emitter 12 and the base 15 can be any one of a group consisting of conductive materials such as Au, Al, Cu, Ag, ITO or IZO, or any combination thereof. The materials for them can also be selected from conductive polymer materials (for example, PEDOT: PSS); or from conductive nanometer structures such as Ag nanometer filaments or CNTs.

In one example, the material for the base 15 can be chosen to be any suitable conductive material depending on the different materials of the first and second organic semiconductor layers 13 and 14, so that the base 15 forms a Schottky contact with the first organic semiconductor layer 13 and forms a Schottky contact with the second organic semiconductor layer 14.

When the first and second organic semiconductor layers 13 and 14 are made of the P-type semiconductor, the material of the base 15 may have low work function, for example Ag, Al or the like. Alternatively, when the first and second organic semiconductor layers 13 and 14 are made of the N-type semiconductor, the material of the base 15 may have high work function, for example Au, Cu or the like.

With the organic transistor provided by the embodiment of the present application, the base 15 along with the first organic semiconductor layer 13 and the second organic semiconductor layer 14 located at either side thereof can form two back-to-back Schottky Contacts, by means of stacking the collector 11, the emitter 12, the first organic semiconductor layer 13, the second organic semiconductor layer 14 and the base 15, so that a built-in electric field is generated to magnify current of the transistor, thereby generating a large current. Due to the stacking arrangement, the path along which the carriers move from the collector 11 to the emitter 12 is relatively short, thereby effectively improving the switching speed. In this way, it can remedy the problem that the organic semiconductor material has a low mobility.

In one specific example, both the first organic semiconductor layer 13 and the second organic semiconductor layer 14 include the P-type organic semiconductor.

Specifically, the P-type organic semiconductor can be PbPc, CuPc or the like.

Because the holes dominate in the P-type organic semiconductor and the holes in the OLED inject from a side where an anode is located, when the organic transistor is applied into the OLED display device, it can dispose the organic transistor close to the anode so that the holes in the organic transistor are directly injected into a light emitting layer from the side where the anode is located, thereby simplifying the structure thereof.

In one example, the base 15 has a thickness in a range of 20-30 nm, for example, 25 nm.

In one example, a sum of thicknesses of the first and second organic semiconductor layers 13 and 14 is 170-230 nm, for example 200 nm.

Since the sum of thicknesses of the first and second organic semiconductor layers 13 and 14 is only approximately 200 nm and the thickness of the base 15 is also very thin, it is in a state of semipermeable membrane. Therefore, it can further reduce the path of the carriers crossing the two organic semiconductor layers and the time which the carriers spend to cross the two organic semiconductor layers becomes shorten. In this way, it is possible to obtain larger current and better performance of the transistor.

Below, data of several experiments are shown to demonstrate the performance of the organic transistor provided by the present application.

Figure 3:
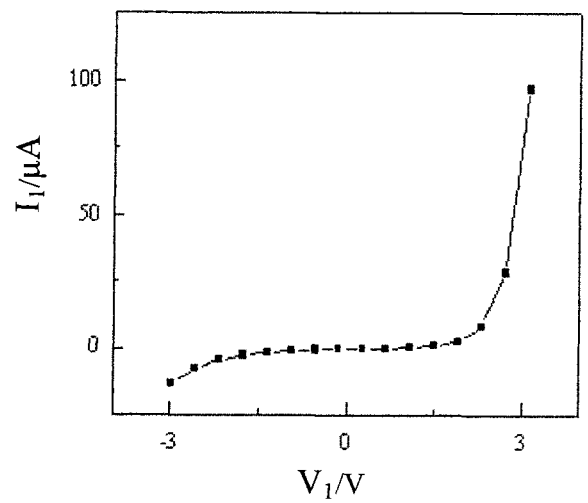
FIG. 3 is a schematic view showing relationship between voltage and current applied at both ends of a Schottky Contact according to an embodiment of the present application.

FIG. 3 shows a curve of relationship between a voltage $V_1$ applied at two ends of the Schottky Contact (i.e., the voltage between the emitter 12 and the base 15) and a current $I_1$ applied at two ends of the Schottky Contact. It can be known that when the applied forward voltage becomes zero, the current becomes zero either; when the forward voltage is small, the forward current is also very small (almost zero), presenting relatively large electrical resistance; after the forward voltage rises to a certain value (i.e., 3V), the built-in electrical field is weaken significantly, and the forward current increases apparently; in a case that the forward voltage is larger than a certain value (i.e., 3V), the forward current nearly rises linearly as the forward voltage rises. It can be seen from the above description that the Schottky contact in the organic transistor has a good I-V characteristic curve.

Figure 4:
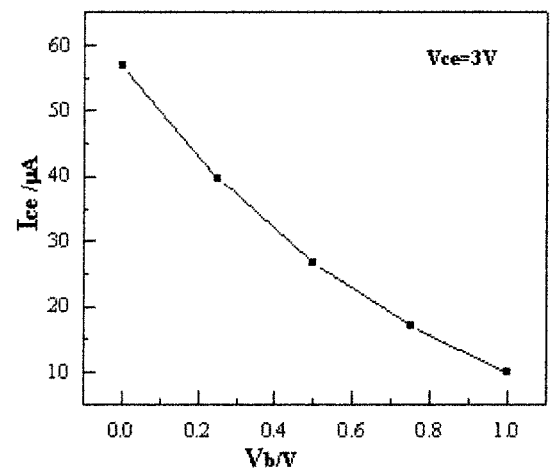
FIG. 4 is a schematic view showing relationship between voltage applied at a base and current between a collector and an emitter according to an embodiment of the present application.

In the case that the voltage $V_{ce}$ between the collector 11 and the emitter 12 is 3V, the curve of relationship between the voltage $V_b$ applied onto the base 15 and the current $I_{ce}$ between the collector 11 and the emitter 12 is as shown in FIG. 4. It can be seen that there is a relatively large slope between $V_b$ and $I_{ce}$. Because the slope of the transistor represents a magnifying factor of the current in the transistor, such organic transistor has a relatively good capability of magnifying the current.

Figure 5:
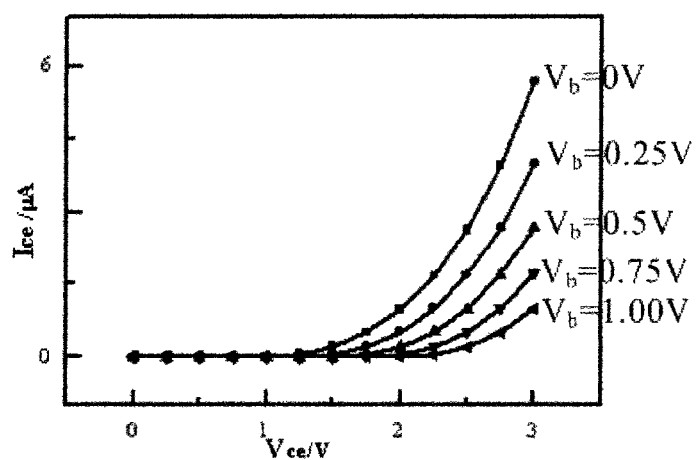
FIG. 5 is a schematic view showing relationship between voltage and current between the collector and the emitter according to an embodiment of the present application.

When different voltages $V_b$ are applied onto the base 15, a curve of relationship between the voltage $V_{ce}$ between the collector 11 and the emitter 12 and the current $I_{ce}$ is as shown in FIG. 5. It can be seen that in the magnifying region, when $V_b$ changes, $I_{ce}$ also changes with a similar trend at a certain proportion. Therefore, the organic transistor has a good output characteristic.

Another embodiment of the present application also provides an OLED display device, which includes a driver transistor and a light emitting layer. The driver transistor is the organic transistor as described above.

The described organic transistor is applied in the OLED display device, to drive the light emitting layer for generating light having different brightness and thus achieve brightness adjustment of the OLED display device.

Figure 6:
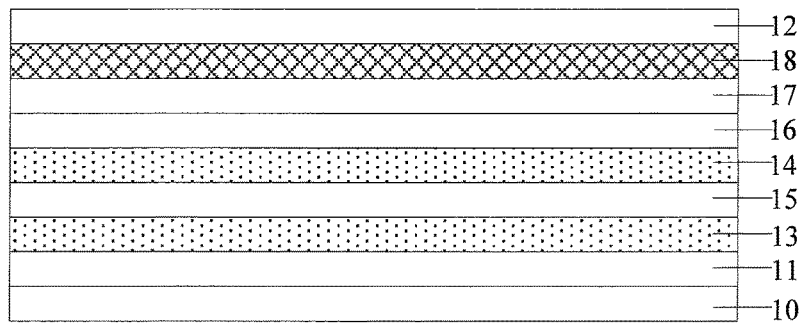
FIG. 6 is a schematic view showing a structure of an OLED display device according to an embodiment of the present application.

As shown in FIG. 6, the OLED display device also includes a hole injection layer 16 and a hole transmission layer 17. On a basis of this, the collector 11 may be located close to the substrate 10. The first organic semiconductor layer 13, the base 15 and the second organic semiconductor layer 14 are in sequence provided above the collector 11. The hole injection layer 16, the hole transmission layer 17 and the light emitting layer 18 can be provided between the second organic semiconductor layer 14 and the emitter 12. The first organic semiconductor layer 13 and the second organic semiconductor layer 14 both include the P-type organic semiconductor.

Since the holes dominate in the P-type organic semiconductor, the holes in the first and second organic semiconductor layers 13 and 14 can directly be injected into the light emitting layer 18 through the hole injection layer 16 and the hole transmission layer 17. After the electrons in the emitter 12 are injected into the light emitting layer 18, the light emitting layer 18 can emit light.

It should be noted that since the holes dominate in the first and second organic semiconductor layers 13 and 14, it is not necessary to provide an anode again, and an interface between the second organic semiconductor layer 14 and the hole injection layer 16 can be considered as the anode.

Further, the emitter 12 is located at a light emitting side of the light emitting layer 18, thus the emitter 12 needs to be transmittable for light. The emitter 12 can be made of transparent conductive materials, for example ITO. Alternatively, it can also be made of metal material, and in this case the emitter 12 needs to be made very thin to make sure that it can transmit light.

In the present embodiment, on one hand, the hole injection layer 16 and the hole transmission layer 17 are provided to improve the hole transmission capability; on the other hand, the cathode and the emitter 12 are integrated without the anode, and thus the structure thereof becomes very simple.

Figure 7:
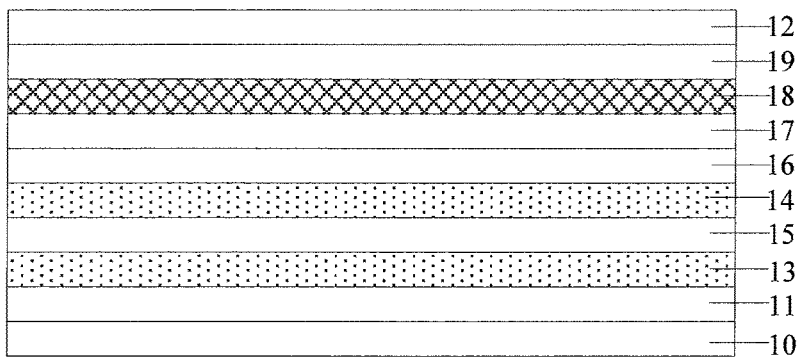
FIG. 7 is a schematic view showing a structure of an improved OLED display device over that as shown in FIG. 6 according to an embodiment of the present application.

Further, as shown in FIG. 7, the OLED display device may further include an electron transmission layer 19 provided between the emitter 12 and the light emitting layer 18. In this way, it can improve the electron transmission capability.

Figure 8:
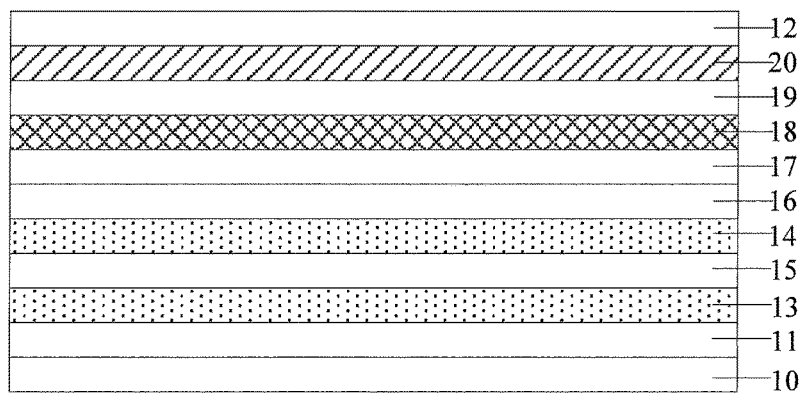
FIG. 8 is a schematic view showing a structure of an improved OLED display device over that as shown in FIG. 7 according to an embodiment of the present application.

Further, as shown in FIG. 8, the OLED display device may further include an electron injection layer 20 provided between the emitter 12 and the electron transmission layer 19. This can further improve the electron transmission capability.

Figure 9:
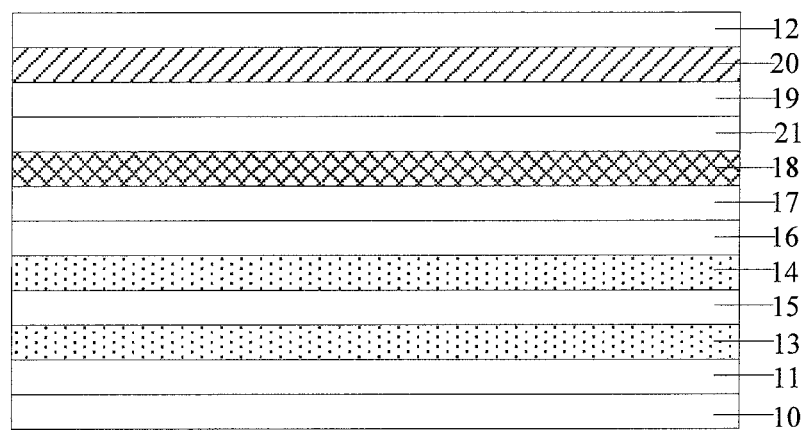
FIG. 9 is a schematic view showing a structure of an improved OLED display device over that as shown in FIG. 8 according to an embodiment of the present application.

Further, as shown in FIG. 9, the OLED display device may further include an hole barrier layer 21 provided between the electron transmission layer 19 and the light emitting layer 18.

A yet embodiment of the present application provides a method for producing an organic transistor. As shown in FIGS. 1 and 2, it includes forming by an evaporation process the collector 11 and the emitter 12 stacked each other on the substrate 10, the first organic semiconductor layer 13, the second organic semiconductor layer 14 and the base 15 stacked between the collector 11 and the emitter 12, wherein the base 15 is located between the first organic semiconductor layer 13 and the second organic semiconductor layer 14.

Specifically, the base 15 and the first organic semiconductor layer 13 form a Schottky contact, and the base 15 and the second organic semiconductor layer 14 form a Schottky contact.

With the method for producing the organic transistor provided by the embodiment of the present application, the base 15 with the first organic semiconductor layer 13 and the second organic semiconductor layer 14 located at either side thereof can form two back-to-back Schottky contacts, by means of stacking the collector 11, the emitter 12, the first organic semiconductor layer 13, the second organic semiconductor layer 14 and the base 15, so that a built-in electric field is generated to magnify current of the transistor, thereby generating a large current. Due to the stacking arrangement, the path along which the carriers move from the collector 11 to the emitter 12 is relatively short, thereby effectively enhancing the switching speed. In this way, it can alleviate the problem that the organic semiconductor material has a low mobility.

On the basis of this, because the organic transistor is made by the same process as that for producing the OLED, this can simplify the producing process thereof.

In one specific example, both the first organic semiconductor layer 13 and the second organic semiconductor layer 14 include the P-type organic semiconductor.

Specifically, the P-type organic semiconductor can be PbPc, CuPc or the like.

Because the holes dominate in the P-type organic semiconductor and the holes in the OLED are injected from a side where an anode is located, when the organic transistor is applied into the OLED display device, it can dispose the organic transistor close to the anode so that the holes in the organic transistor are directly injected into a light emitting layer from the side where the anode is located, thereby simplifying the structure thereof.

In one example, the base 15 has a thickness in a range of 20-30 nm, for example, 25 nm.

In one example, a sum of thicknesses of the first and second organic semiconductor layers 13 and 14 is 170-230 nm, for example 200 nm.

Since the sum of thicknesses of the first and second organic semiconductor layers 13 and 14 is only approximately 200 nm and the thickness of the base 15 is also very thin, it is in a state of semipermeable membrane. Therefore, it can further reduce the path of the carriers crossing the two organic semiconductor layers and the time which the carriers spend to cross the two organic semiconductor layers becomes shorten. In this way, it is possible to obtain larger current and better performance of the transistor.

With the organic transistor, the method for producing the organic transistor, and the OLED display device provided by the embodiments of the present application, the base with the first organic semiconductor layer and the second organic semiconductor layer located at either side thereof can form two back-to-back Schottky contacts, by means of stacking the collector, the emitter, the first organic semiconductor layer, the second organic semiconductor layer and the base, so that a built-in electric field is generated to magnify current of the transistor, thereby generating a large current. Due to the stacking arrangement, the path along which the carriers move from the collector 11 to the emitter 12 is relatively short, thereby effectively improving the switching speed. In this way, it can remedy the problem that the organic semiconductor material has a low mobility.

The above described embodiments are exemplary embodiments of the present application, instead of limiting the present application. All of modifications, alternatives, improvements made without departing from the principles and spirit of the disclosure should fall within the protection scope of the present application. Therefore, the protection scope of the present application shall be defined by the attached pending claims.

What is claimed is:

1. An OLED display device comprising:
   a driver transistor, a hole injection layer, a hole transmission layer and a light emitting layer, wherein the driver transistor is the organic transistor comprising:
   a collector and an emitter stacked above a substrate;
   a first organic semiconductor layer, a second organic semiconductor layer and a base between the first and second organic semiconductor layers, stacked and provided between the collector and the emitter;
   wherein the base forms a Schottky contact with the first organic semiconductor layer and forms a Schottky contact with the second organic semiconductor layer;
   wherein the collector in the organic transistor is located close to the substrate, the first organic semiconductor layer, the base and the second organic semiconductor layer are provided above the collector in sequence, and the hole injection layer, the hole transmission layer and the light emitting layer are provided between the second organic semiconductor layer and the emitter in sequence.

2. The OLED display device according to claim 1, wherein both the first organic semiconductor layer and the second organic semiconductor layer comprise P-type semiconductor or N-type semiconductor.

3. The OLED display device according to claim 1, wherein both the first organic semiconductor layer and the second organic semiconductor layer are made of P-type semiconductor, and the base is made of a material having a low work function; or
   both the first organic semiconductor layer and the second organic semiconductor layer are made of N-type semiconductor, and the base is made of a material having a high work function.

4. The OLED display device according to claim 2, wherein the P-type semiconductor is PbPc or CuPc.

5. The OLED display device according to claim 1, wherein materials of the collector, the emitter and the base are selected from any of Au, Al, Cu, Ag, ITO, IZO, conductive polymer materials and conductive nanometer structures or any combination thereof.

6. The OLED display device according to claim 1, wherein a thickness of the base is in a range of 20-30 nm.

7. The organic OLED display device according to claim 1, wherein a sum of thicknesses of the first organic semiconductor layer and the second organic semiconductor layer is in a range of 170-230 nm.

8. The OLED display device according to claim 1, wherein one of the collector and the emitter is located close to the substrate, while the other one of them is located distant from the substrate.

9. The OLED display device according to claim 1, wherein
   both the first organic semiconductor layer and the second organic semiconductor layer comprise P-type semiconductor.

10. The OLED display device according to claim 9, wherein the OLED display device further comprises an electron transmission layer provided between the emitter and the light emitting layer.

11. The OLED display device according to claim 10, wherein the OLED display device further comprises an electron injection layer provided between the emitter and the electron transmission layer.

12. The OLED display device according to claim 10, wherein the OLED display device further comprises a hole barrier layer provided between the electron transmission layer and the light emitting layer.

* * * * *